United States Patent [19]

Cronin et al.

[11] Patent Number: 5,189,506
[45] Date of Patent: Feb. 23, 1993

[54] TRIPLE SELF-ALIGNED METALLURGY FOR SEMICONDUCTOR DEVICES

[75] Inventors: John E. Cronin, Milton; Carter W. Kaanta, Colchester, both of Vt.

[73] Assignee: International Business Machines Corporation, Armonk, N.Y.

[21] Appl. No.: 894,178

[22] Filed: Jun. 3, 1992

Related U.S. Application Data

[63] Continuation of Ser. No. 546,175, Jun. 29, 1990, abandoned.

[51] Int. Cl.$^5$ .............................................. H01L 23/48
[52] U.S. Cl. .................................. 257/752; 257/758; 257/774
[58] Field of Search ...................... 437/189, 924, 984; 148/DIG. 102; 357/68, 69, 71

[56] References Cited

U.S. PATENT DOCUMENTS

| | | | |
|---|---|---|---|
| 4,582,563 | 4/1986 | Hazuki et al. | 156/643 |
| 4,789,648 | 12/1988 | Chow et al. | 437/225 |
| 4,892,843 | 1/1990 | Schmitz | 437/192 |

OTHER PUBLICATIONS

IBM TDB-Cronin et al.-vol. 31, No. 4, Sep. 1988 pp. 400-401.
IBM TDB, vol. 30, #7, Dec. 1987, pp. 195-196, "Single Mask and Imaging For A Dual Level Self Aligned Definition", J. E. Cronin.
Patent Application 516,394 (BU-9-89-025), J. E. Cronin et al., "Process for Forming Multi-Level Coplanar Conductor/Insulator Films Employing Photosensitive Polyimide Polymer Compositions".
"Polyimide Film Properties and Selective LPCVD of tungsten on Polyimide" R. W. Patee et al., J. Electrochemical Society, Jun. 1988, pp. 1477-1483.
1988 Symposium on VLSI Technology Digest of Technical Papers, pp. 71-72, May 10-13, K. Mitsuhashi et al., "Thermally Stable . . . ".
Patent Application 337,807 (BU-9-86-005A), J. E. Cronin et al., "A Multi-Level Integrated Circuit Wiring Structure from a Single Metal Deposit".

*Primary Examiner*—Edward J. Wojciechowicz
*Attorney, Agent, or Firm*—Howard J. Walter, Jr.

[57] ABSTRACT

A process is described which eliminates the need to account for mask alignment tolerances in forming vias for metallurgy by the use of a common vertical edge or common plane defined by a first mask representing a first level of interconnect. Subsequent masks for defining interconnecting vias and a second level of interconnect utilize at least one edge of the first mask pattern as a common element to define subsequent metal levels. The combination of an etch stop layer and an oversized second level mask enable the mask overlay to be eliminated.

3 Claims, 2 Drawing Sheets

TRIPLE SELF-ALIGNED METALLURGY FOR SEMICONDUCTOR DEVICES

This is a continuation of copending application Ser. No. 07/546,175 filed on Jun. 29, 1990, now abandoned

FIELD OF THE INVENTION

This invention relates to the interconnection structures for semiconductor devices and more particularly to methods and structures for interconnecting metallurgical lines in a plurality of different levels in a self-aligned manner.

BACKGROUND OF THE INVENTION

In the development of VLSI device technology it has long been a desire to provide as many self-aligning features in a process as practical. Each self-aligned technology segment has the capability of reducing the required area taken by a combination of integrated circuit devices, thus increasing density as well as reducing the cost to manufacture components.

Traditionally, semiconductor processes utilize minimum definable dimensions only at the earliest process steps because, as the mask defining levels increase, alignment tolerances become cumulative and positioning of technology segments for proper alignment to lower levels requires the use of increased dimensions for each successive level. In many semiconductor processes 15 or more mask levels are required rendering the final metalization steps, or Back End Of the Line (BEOL), a limiting factor in obtaining greater VLSI densities.

Another factor effecting usable densities for BEOL technology has been that, as the number of process steps increase, the upper surface of the semiconductor substrate becomes more and more irregular or non-planar. In order to provide for adequate functional structures, larger dimensions were needed for contact via holes between different levels of interconnect metallurgy.

Recently it has become clear that in order to continue to provide increases in circuit density, improved techniques would be required. One of the improvements has been the development of techniques for achieving greater planarity in both metallurgy used for interconnects and its associated dielectric layers. For example, one planarization technique is that of Chemical-Mechanical, or Chem-Mech, Polishing (CMP) as described in greater detail in Beyer et al U.S. Pat. No. 9,944,836, issue Jul. 31, 1990, entitled "Chem-Mech Polishing Method for Producing Coplanar Metal/Insulator Films on a Substrate," based on application Ser. No. 791,860, filed Oct. 25, 1985 and assigned to the assignee of the instant application. CMP enables metal, dielectric or both to be planarized in order to reduce the processing and alignment tolerances required to fabricate high density devices.

High density BEOL processing has evolved from the use of a single layer of metal as both the interlevel via and interconnect to the use of separately definable via stud and line processing. Hazuki et al U.S. Pat. No. 4,582,563 issued Apr. 15, 1986 is an example of such technology in which a separate via stud is formed to act as the vertical interconnect and a substantially planar interconnect line is used for horizontal interconnects.

Another technique useful in reducing or eliminating alignment tolerances is that of providing self-aligning features in one or more mask levels. Several techniques are known to enable the formation of self-aligned studs and interconnecting lines. The article "Single Mask and Imaging for a Dual Level Self Aligned Definition," IBM Technical Disclosure Bulletin, December 1987, pp. 195-6 teaches a "studs up" self aligned technique. Chow et al U.S. Pat. No. 4,789,648 issued Dec. 6, 1988, entitled "Method for Producing Coplanar Multi-Level Metal Insulator Films on a Substrate and for Forming Patterned Conductive Lines Simultaneously with Stud Vias," and assigned to the assignee of the subject invention, the article "Single-Step, Multilevel, Metalization Technique for Conformal Wiring," IBM Technical Disclosure Bulletin, September 1988, pp. 400-1, and U.S. patent application Ser. No. 516,394 (BU9-89-025) by Cronin et al, filed Apr. 30, 1990, entitled "Process for Forming Multi-level Coplanar Conductor/Insulator Films Employing Photosensitive Polyimide Polymer Compositions" teach different techniques for forming self-aligned "studs down" interconnect metallurgy. Cronin et al U.S. Pat. No. 4,962,058 issue Oct. 9, 1990, entitled "A Multi-Level Integrated Circuit Wiring Structure from a Single Metal Deposit," and assigned to the assignee of the subject invention teaches a technique for forming both stud up and stud down structures. In each of the above references, both the stud and one of the interfacing layers of metallurgy are formed by a process in which a self-alignment between stud and line is achieved.

If circuit densities are to continue to increase, additional techniques are needed to further enhance BEOL technology.

It is therefore an object of this invention to provide substantial enhancement in the ability to obtain self-alignment for multiple levels of interconnect metallurgy by providing triple-level self-aligned metallurgy.

It is a further object to provide a process for achieving self-alignment between a first level of interconnect, a second level of interconnect, and their associated studs.

SUMMARY OF THE INVENTION

The invention eliminates the need to account for mask alignment tolerances in forming vias for metallurgy by the use of a common vertical edge or common plane defined by a first mask representing a first level of interconnect. Subsequent masks for defining interconnecting vias and a second level of interconnect utilize at least one edge of the first mask pattern as a common element to define subsequent metal levels. The combination of an etch stop layer and an oversized second level mask enable the mask overlay to be eliminated.

These and other features of the invention will be described in further detail in the accompanying drawings and specification.

DETAILED DESCRIPTION OF THE INVENTION

In order to successfully practice the subject invention, it will be understood that various teachings of the prior art may be required. The following references, hereby incorporated by reference, are representative of some of the special technologies which may be necessary to practice the invention.

Chem-Mech Polishing used to planar and coplanarize surfaces is described in the Beyer et al, the Chow et al and both of the Cronin et al references referred to above.

Methods for the formation of refractory metals, such as tungsten, for studs and interconnects include the articles "Process for Selective Chemical Vapor Deposition of Tungsten Studs," anonymous, Research Disclosure, May 1988, item 28923, for seeded CVD, Schmitz et al U.S. Pat. No. 4,892,843, issued Jan. 9, 1990 for CVD of tungsten from tungsten hexafluoride and silane, the article "Polyimide Film Properties and Selective LPCVD of Tungsten on Polyimide," by R. W. Patee et al, J. Electrochemical Society, June 1988,pp. 1477-83, for the use of tungsten in organic dielectric BEOL environment, and the article "Thermally Stable and Completely Planarized Multilevel Interconnection with Selective CVD-W Via and 31P+/11B+ implanted WSix/TiN/Si Contact," by K. Mitsuhashi et al, 1988 Symposium on VLSI Technology Digest of Technical Papers, pp. 71-2, May 10-13, 1988, for the use of selective tungsten studs in multilevel metallurgy BEOL processes.

Figure 1:
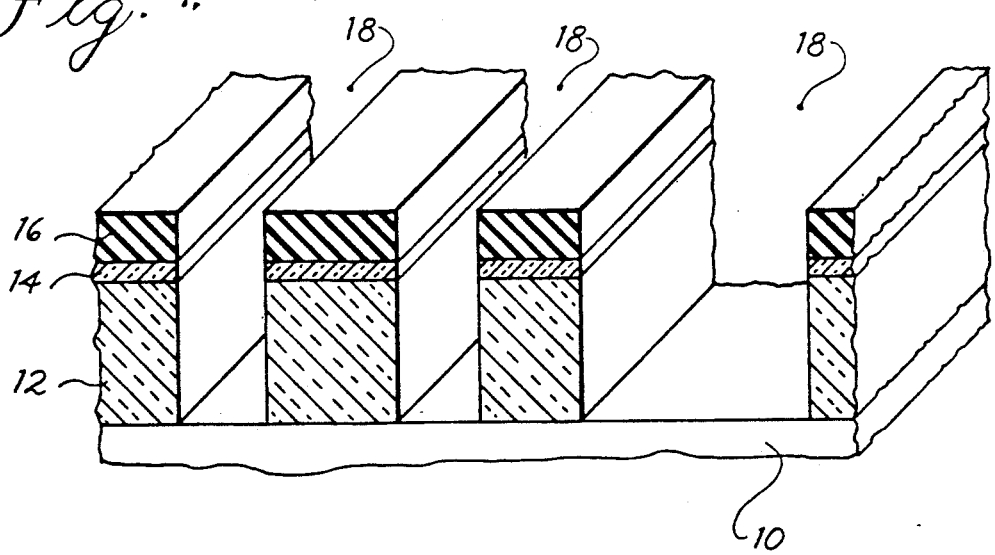
FIGS. 1 through 5 are sectional isometric views of a partially fabricated semiconductor device during the practice of the invention in which an initially mask defined plane in a dielectric layer is used as the defining edge of three different metallurgical layers.

Referring to FIG. 1 there is shown a partially processed semiconductor substrate 10 containing a plurality of regions (not shown) to be contacted by a first level of metallurgy. Overlying substrate 10 is a passivation dielectric layer 12 which has been planarized, preferably by a CMP process. Layer 12 may be a conventional silicon dioxide or boron and/or phosphorus doped glass or an organic material such as polyimide. Overlying dielectric layer 12 is an etch stop layer 14 which may be silicon nitride, aluminum oxide or other material which can be selectively etched with respect to dielectric layer 12.

In order to define a first level of metallurgy (M1) for interconnecting various regions of devices on substrate 10, a masking layer 16 has been formed and selectively patterned to define channels 18. Although shown as regular and parallel, the channels make take any desired configuration.

Figure 2:
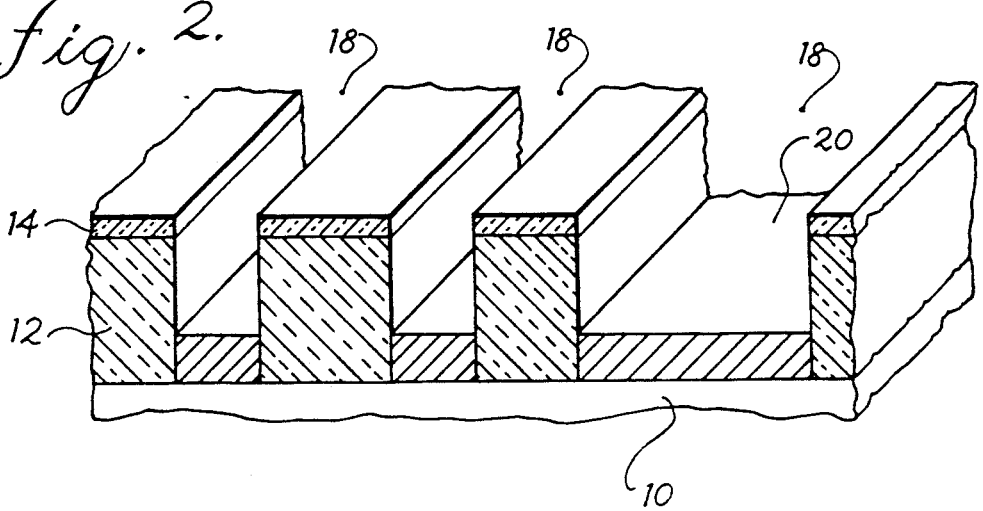
Figure 3:
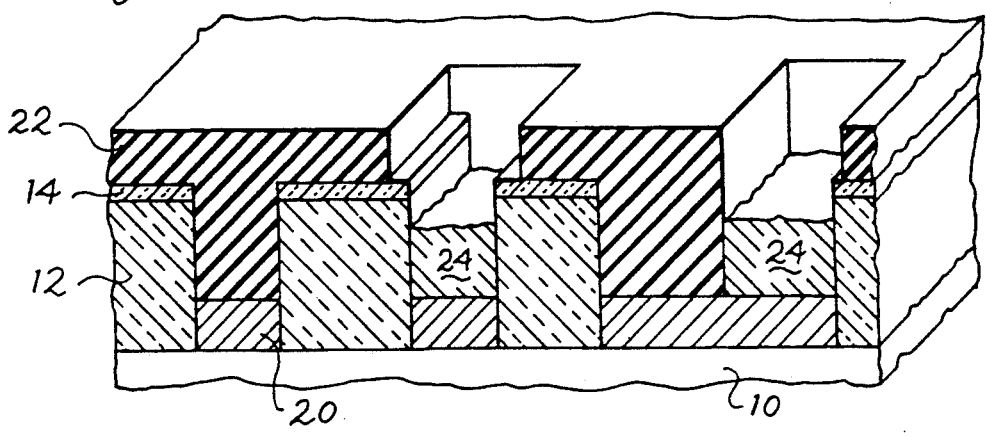

Following the definition of the M1 channels, a conductive layer is formed to conform to the path of the channels over the substrate. As shown in FIG. 2, first metallurgical layer 20 can be formed by any number of known techniques. For example, a lift-off deposition process can be used. Other techniques include the use of Ion Cluster Beam technology or any directional deposition process. It is a significant feature that the deposition of M1 20 not be deposited to fill the pattern formed by the mask 16. Following the deposition of M1, the mask 16 is removed by a process suitable to the material of the mask.

Using a mask material suitable to the stud formation process, mask 22 is formed on the substrate, FIG. 2. If the studs are to be formed by an electroless process, an organic resist can be used. If selective tungsten is used to form the studs, a polyimide or oxide mask or other insulative mask is required. After formation of mask 22, selected portions of M1 will be exposed at the locations studs are required. Since the formation is a selective process, mask 22 is a noncritical alignment. Note that at least one edge of each stud is defined by the initial dielectric 12 channel edges. Studs 24 are then formed to partially fill the stud vias.

After removal of mask 22, the entire surface of the substrate is covered be a second dielectric 26, preferably an oxide, is deposited and planarized by CMP or by Reaction Ion Etching (RIE) etchback process to planarize the surface of the substrate at a level of the non-etchable mask 14.

Figure 4:
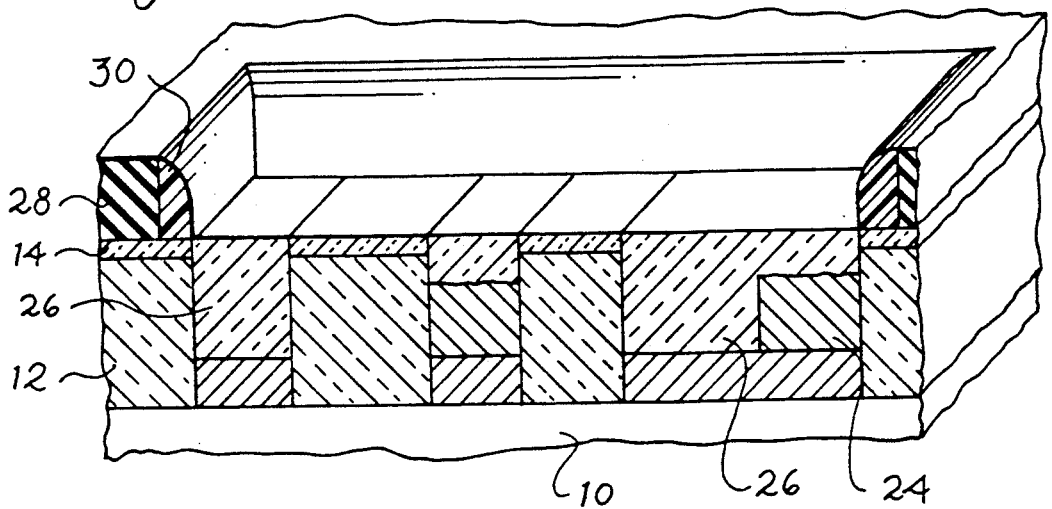

Next, as shown in FIG. 4, a mask 28 defining the second level M2 of interconnect is deposited over the planarized surface. Mask 28 is intentionally made larger than the required metallization pattern by the process overlay tolerance. Next, a sidewall spacer 30 is formed by deposition of a suitable conformal layer of material to a thickness equal to the overlay tolerance. A directional RIE technique is used to form spacers 30 on the interior perimeter. This step is performed to insure that the original edges of dielectric 12 and it overlying non-etchable layer 14 are not exposed at the edges of mask 28. Any exposed portions of layer 14 are then etched away exposing dielectric 12 in the opening defining interconnect pattern for M2. Exposed dielectric layers 12 and 26 are then selectively etched to a depth sufficient to expose ant previously formed studs 24. Next, the spacer 30 is selectively removed to expose portions of layer 14 originally defined by mask 16. M2 mask 28 is then removed. The result of this step is an M2 recessed image self-aligned to the original edges of dielectric 12 as defined by mask 14.

Figure 5:
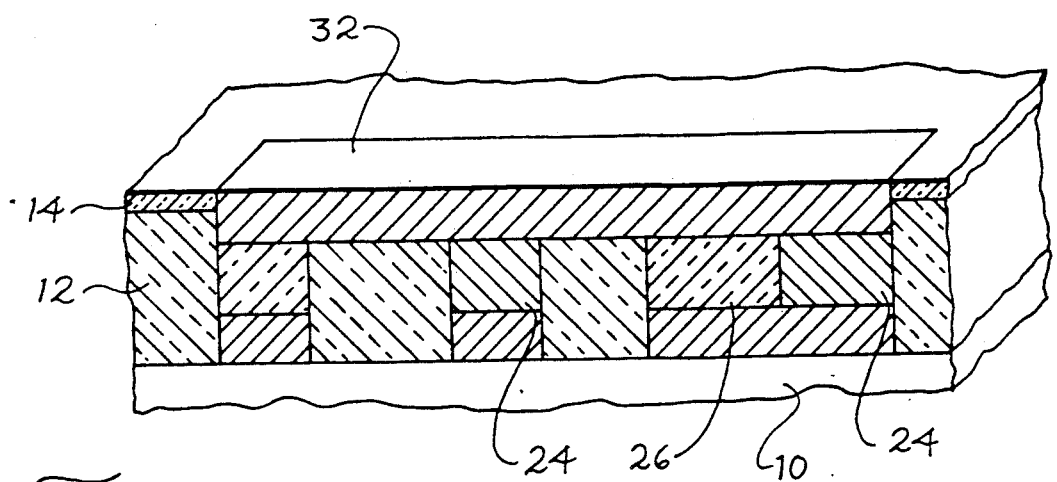

Next, as shown in FIG. 5, second level metal can be blanket deposited. A CMP or other suitable process such as a Reactive Ion Etch process is used to coplanarize the entire substrate surface leaving the M2 pattern 32 defined within the surface of dielectric 12. The edges of layer 32 are self-aligned to the original pattern of mask 16 at those portions overlying studs 24.

Figure 6:
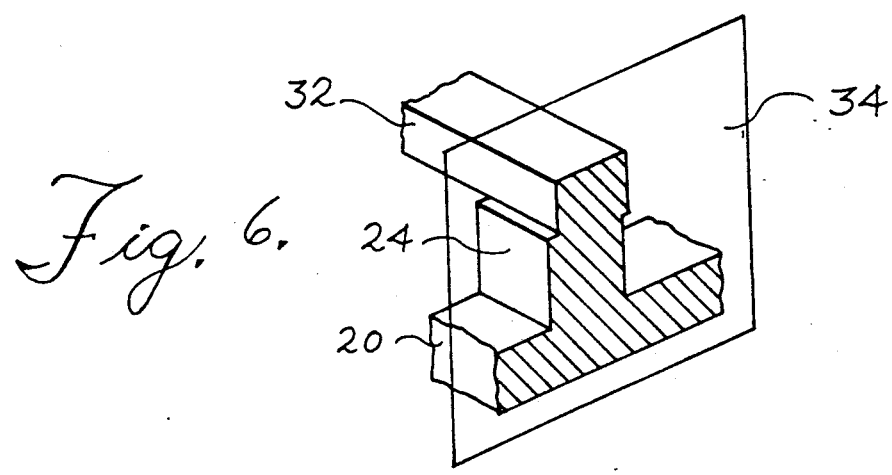
FIG. 6 is an idealized view of a hypothetical structure showing the common plane which defines three levels of interconnect.

Referring now to FIG. 6 there is shown a schematic representation of an idealized plane 34 defined by the M1 mask 16. As can be seen, as represented by the shaded area, each of layers forming M1 20, stud 24 and M2 32 are coplanar with plane 34.

While the invention has been shown in terms of a single embodiment, those skilled in the art will realize that other forms of the invention can be realized by utilization of additional well known processing techniques.

What is claimed is:

1. A metallurgical structure for an integrated circuit having a conductive member formed in a recess in a layer of insulating material by sequential first, second and third mask-definable layers of conductive material characterized in that each of said layers of conductive material has a substantially vertical surface portion adjacent to said insulating material and terminating in at least one common plane defined in said insulating material by said first mask.

2. The structure of claim 1 wherein the first mask-definable layer represents a first metallurgical interconnection layer, the second mask-definable layer represents a stud interconnection layer and the third mask-definable layer represents a second metallurgical interconnection layer.

3. The structure of claim 1 wherein said common plane is formed by a dielectric layer defined by a first mask.

* * * * *